(12) United States Patent
Wu (10) Patent No.: US 9,304,537 B2
(45) Date of Patent: Apr. 5, 2016

(54) ORGANIC LIGHT EMITTING DIODE DEVICE AND DISPLAY APPARATUS CORRESPONDING THERETO

(71) Applicant: Yuan-Chun Wu, Guangdong (CN)

(72) Inventor: Yuan-Chun Wu, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 192 days.

(21) Appl. No.: 13/703,081

(22) PCT Filed: Oct. 17, 2012

(86) PCT No.: PCT/CN2012/083093
§ 371 (c)(1),
(2) Date: Dec. 10, 2012

(87) PCT Pub. No.: WO2014/056241
PCT Pub. Date: Apr. 17, 2014

(65) Prior Publication Data
US 2014/0184479 A1    Jul. 3, 2014

(30) Foreign Application Priority Data
Oct. 12, 2012  (CN) .......................... 2012 1 0385726

(51) Int. Cl.
| | | |
|---|---|---|
| G06F 3/0346 | (2013.01) | |
| G06F 1/16 | (2006.01) | |
| G09G 3/32 | (2006.01) | |
| H05B 33/08 | (2006.01) | |

(52) U.S. Cl.
CPC ............ *G06F 1/1601* (2013.01); *G09G 3/3208* (2013.01); *H05B 33/0896* (2013.01)

(58) Field of Classification Search
CPC .......................................... G09G 3/30–3/3291
USPC ...................... 345/76–83, 204, 690
See application file for complete search history.

(56) References Cited

U.S. PATENT DOCUMENTS

| | | | |
|---|---|---|---|
| 7,791,700 B2* | 9/2010 | Bellamy | 349/149 |
| 8,217,396 B2* | 7/2012 | Yamazaki et al. | 257/72 |
| 2008/0079360 A1* | 4/2008 | Kubota | 313/505 |
| 2009/0322214 A1* | 12/2009 | Lee et al. | 313/504 |
| 2010/0171687 A1* | 7/2010 | Chiang et al. | 345/98 |
| 2011/0074705 A1* | 3/2011 | Yousefpor | G06F 3/0412 345/173 |

* cited by examiner

*Primary Examiner* — Ilana Spar
*Assistant Examiner* — Jeffrey S Steinberg
(74) *Attorney, Agent, or Firm* — Kirton McConkie; Evan R. Witt (57) ABSTRACT

The present invention relates to an organic light emitting diode device and a display apparatus corresponding thereto. The organic light emitting diode device comprises a plurality of pixels. Each pixel comprises an organic light emitting unit and a driving unit. The organic light emitting unit is disposed in a displaying region. The driving unit is disposed in a driving region. The driving region overlaps the displaying region and the driving region is smaller than the displaying region. According to the organic light emitting diode device and corresponding display apparatus of the present invention, it is easier to fulfill the organic light emitting diode device with narrow bezel.

17 Claims, 5 Drawing Sheets

ORGANIC LIGHT EMITTING DIODE DEVICE AND DISPLAY APPARATUS CORRESPONDING THERETO

BACKGROUND OF THE INVENTION

1. Field of the Invention

The present invention relates to an organic electroluminescent technology, and more particularly, to an organic light emitting diode device and a corresponding display apparatus capable of achieving narrow bezel.

2. Description of Prior Art

Figure 1A:
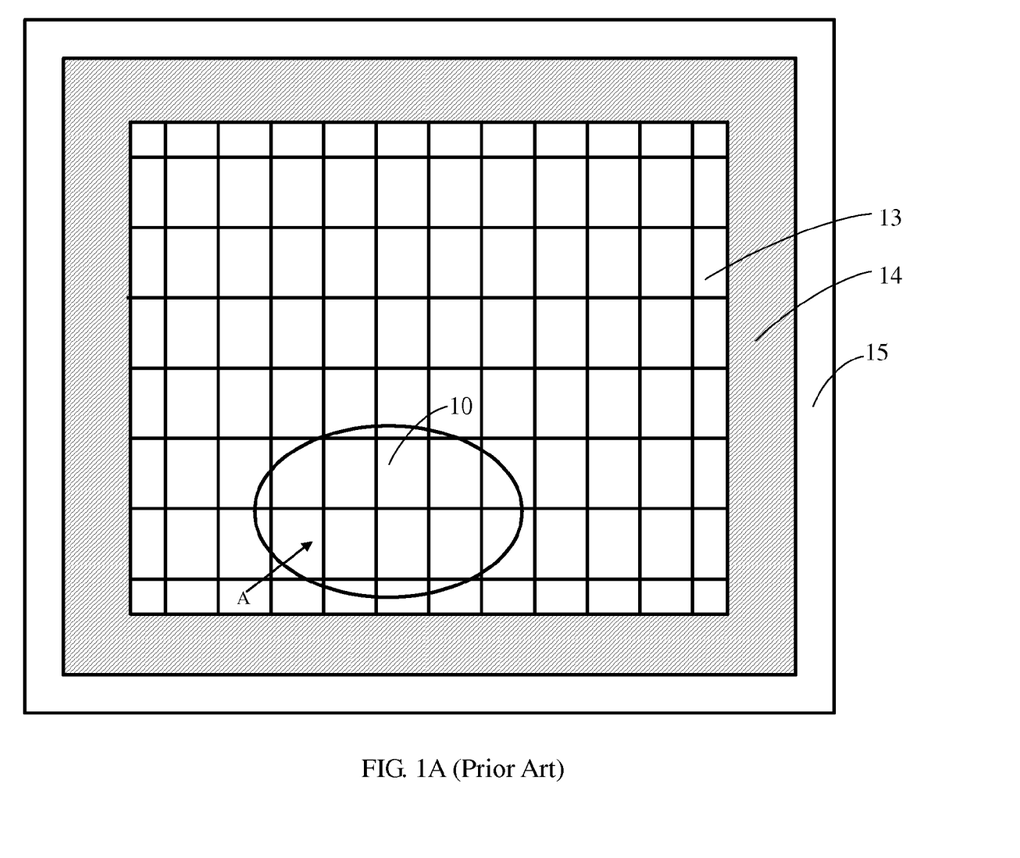
FIG. 1A is a schematic structural diagram showing a conventional organic light emitting diode device.
Figure 1B:
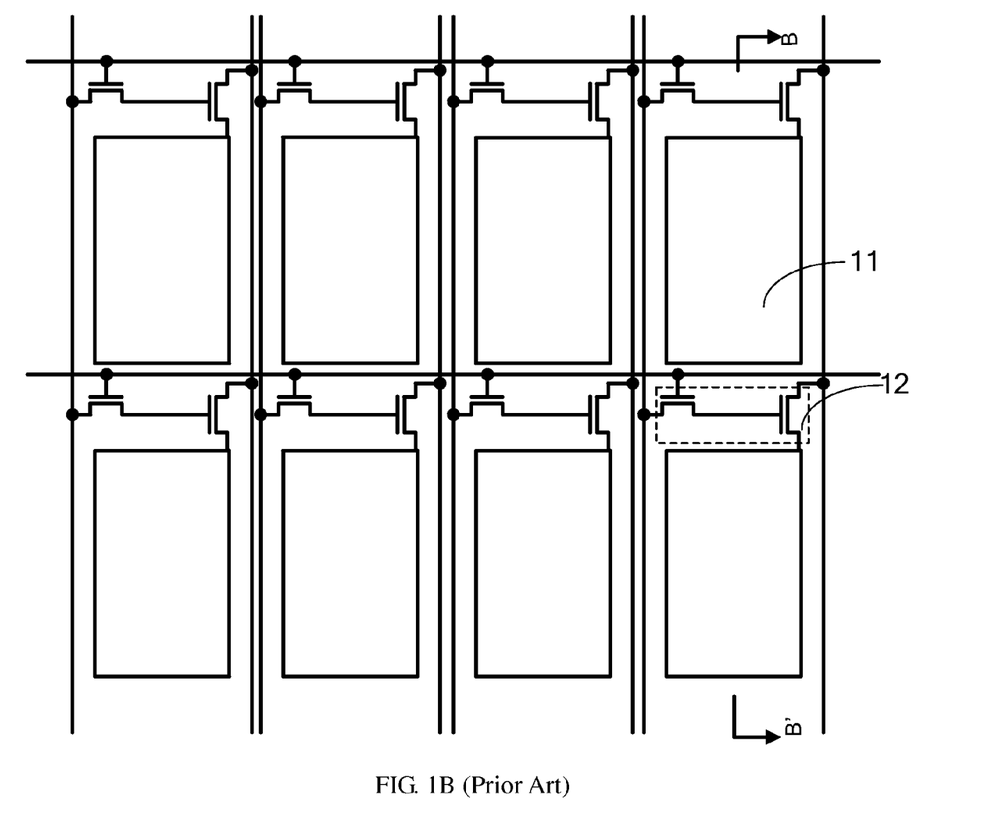
FIG. 1B is a schematic enlarged structural diagram of Part A shown in FIG. 1A.
Figure 1C:
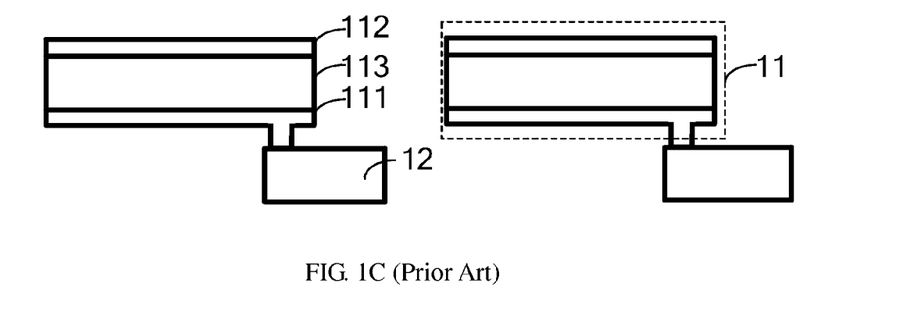
FIG. 1C is a sectional view of FIG. 1B along B-B' direction.

Liquid crystal displays (LCDs) can achieve a perfect image display effect without any external light. Once the external light (e.g., sunlight) exists, the image display effect will get worse. For such a problem caused in the liquid crystal displays, an OLED (organic light emitting diode) display device is developed. FIG. 1A is a schematic structural diagram showing a conventional organic light emitting diode device. FIG. 1B is a schematic enlarged structural diagram of Part A shown in FIG. 1A. FIG. 1C is a sectional view of FIG. 1B along B-B' direction. As shown in FIGS. 1A to 1C, the organic light emitting diode device comprises a plurality of pixels 10. Each pixel 10 comprises an organic light emitting unit 11 and a driving unit 12. The organic light emitting unit 11 comprises an anode 111, a cathode 112, and a plurality of organic emitting layers 113 disposed between the anode 111 and the cathode 112. The driving unit 12 is utilized for driving the corresponding organic light emitting unit 11. When the organic light emitting diode device works, a hole at the anode 111 and an electron at the cathode 112 are recombined at the organic emitting layers 113 and thereby an exciton forms. When the exciton goes back to a ground state, energy is released and thus light rays are emitted.

As shown in FIG. 1A, the organic light emitting diode device comprises three regions, which respectively are a displaying region 13, a driving region (not labeled, completely overlapping the displaying region), a border region 14, and a packaging region 15. The occupied area of the whole organic light emitting units 11 (i.e., displaying region 13) of the organic light emitting diode device is completely identical to that of the whole driving units 12 (i.e., the driving region). Accordingly, other wires or circuits (e.g., scan signal wires and a scan signal driving circuit) of the organic light emitting diode device have to be disposed outside the displaying region 13, that is, an area referring to the border region 14 herein. The existence of the border region 14 makes the organic light emitting diode device hard to be implemented with narrow bezel.

Therefore, it is necessary to provide an organic light emitting diode device and corresponding display apparatus for solving the conventional technical problems.

SUMMARY OF THE INVENTION

An objective of the present invention is to provide an organic light emitting diode device and corresponding display apparatus that have a displaying region larger than a driving region such that a border region of the organic light emitting diode device can overlap the displaying region, thereby it is easier to fulfill the organic light emitting diode device with narrow bezel, solving the technical problem of difficulty to achieve narrow bezel in the conventional organic light emitting diode device and corresponding display apparatus.

To solve above problems, the present invention provides technical schemes as below.

The present invention relates to an organic light emitting diode device, which comprises a plurality of pixels, each pixel comprising: an organic light emitting unit, for emitting light rays with corresponding colors; and a driving unit corresponding to the organic light emitting unit, for driving the corresponding organic light emitting unit; wherein the organic light emitting unit is connected to the corresponding driving unit via a metal connecting layer, the organic light emitting unit is disposed in a displaying region of the organic light emitting diode device, the driving unit is disposed in a driving region of the organic light emitting diode device, the driving region overlaps the displaying region, and the driving region is smaller than the displaying region; wherein the driving region overlaps a central part of the displaying region; wherein the organic light emitting diode device further comprises a data signal driving circuit and a scan signal driving circuit that are disposed in a first border region of the organic light emitting diode device, and further comprises power signal wires, data signal wires, and scan signal wires that are disposed in a second border region of the organic light emitting diode; the second border region overlaps at least one side of the displaying region.

The present invention relates to an organic light emitting diode device, which comprises: a plurality of pixels, each pixel comprising: an organic light emitting unit, for emitting light rays with corresponding colors; and a driving unit corresponding to the organic light emitting unit, for driving the corresponding organic light emitting unit; wherein the organic light emitting unit is connected to the corresponding driving unit via a metal connecting layer, the organic light emitting unit is disposed in a displaying region of the organic light emitting diode device, the driving unit is disposed in a driving region of the organic light emitting diode device, the driving region overlaps the displaying region, and the driving region is smaller than the displaying region.

In the organic light emitting diode device of the present invention, the driving region overlaps a central part of the displaying region.

In the organic light emitting diode device of the present invention, the organic light emitting diode device further comprises a data signal driving circuit and a scan signal driving circuit that are disposed in a first border region of the organic light emitting diode device, and power signal wires, data signal wires, and scan signal wires that are disposed in a second border region of the organic light emitting diode device; the second border region overlaps at least one side of the displaying region.

In the organic light emitting diode device of the present invention, the first border region overlaps at least one side of the displaying region if the data signal driving circuit and the scan signal driving circuit are manufactured on a glass substrate by deposition.

In the organic light emitting diode device of the present invention, the organic light emitting diode device further comprises an encapsulation object for packaging the organic light emitting diode device, wherein the encapsulation object is disposed in a packaging region of the organic light emitting diode device and the packaging region is located outside the first border region.

In the organic light emitting diode device of the present invention, the organic light emitting unit comprises: an anode; a cathode; and a plurality of organic emitting layers disposed between the anode and the cathode.

In the organic light emitting diode device of the present invention, the organic light emitting diode device further comprises: a scan line, for providing scan signals; a data line, for providing data signals; and a power line, for providing power signals; the driving unit comprising: a driving transistor, for driving the corresponding organic light emitting unit; and a switching transistor, for controlling the driving transistor to turn on and off; wherein a control terminal of the switching transistor is connected to the scan signal driving circuit sequentially via the scan line and the scan signal wire, an input terminal of the switching transistor is connected to the data signal driving circuit sequentially via the data line and the data signal wire, an output terminal of the switching transistor is connected to a control terminal of the driving transistor, an input terminal of the driving transistor is connected to an outer power source sequentially via the power line and the power signal wire, and an output terminal of the driving transistor is connected to the organic light emitting unit via the metal connecting layer.

In the organic light emitting diode device of the present invention, the metal connecting layer and the output terminal of the driving transistor are located at a same metal layer.

In the organic light emitting diode device of the present invention, the metal connecting layer and the output terminal of the driving transistor are located at different metal layers.

The present invention also relates to a display apparatus, having an organic light emitting diode device, which comprises: a plurality of pixels, each pixel comprising: an organic light emitting unit, for emitting light rays with corresponding colors; and a driving unit corresponding to the organic light emitting unit, for driving the corresponding organic light emitting unit; wherein the organic light emitting unit is connected to the corresponding driving unit via a metal connecting layer, the organic light emitting unit is disposed in a displaying region of the organic light emitting diode device, the driving unit is disposed in a driving region of the organic light emitting diode device, the driving region overlaps the displaying region, and the driving region is smaller than the displaying region.

In the display apparatus of the present invention, the driving region overlaps a central part of the displaying region.

In the display apparatus of the present invention, the organic light emitting diode device further comprises a data signal driving circuit and a scan signal driving circuit that are disposed in a first border region of the organic light emitting diode device, and further comprises power signal wires, data signal wires, and scan signal wires that are disposed in a second border region of the organic light emitting diode device; the second border region overlaps at least one side of the displaying region.

In the display apparatus of the present invention, the first border region overlaps at least one side of the displaying region if the data signal driving circuit and the scan signal driving circuit are manufactured on a glass substrate by deposition.

In the display apparatus of the present invention, the organic light emitting diode device further comprises an encapsulation object for packaging the organic light emitting diode device, wherein the encapsulation object is disposed in a packaging region of the organic light emitting diode device and the packaging region is located outside the first border region.

In the display apparatus of the present invention, the organic light emitting unit comprises: an anode; a cathode; and a plurality of organic emitting layers disposed between the anode and the cathode.

In the display apparatus of the present invention, the organic light emitting diode device further comprises: a scan line, for providing scan signals; a data line, for providing data signals; and a power line, for providing power signals; the driving unit comprising: a driving transistor, for driving the corresponding organic light emitting unit; and a switching transistor, for controlling the driving transistor to turn on and off; wherein a control terminal of the switching transistor is connected to the scan signal driving circuit sequentially via the scan line and the scan signal wire, an input terminal of the switching transistor is connected to the data signal driving circuit sequentially via the data line and the data signal wire, an output terminal of the switching transistor is connected to a control terminal of the driving transistor, an input terminal of the driving transistor is connected to an outer power source sequentially via the power line and the power signal wire, and an output terminal of the driving transistor is connected to the organic light emitting unit via the metal connecting layer.

In the display apparatus of the present invention, the metal connecting layer and the output terminal of the driving transistor are located at a same metal layer.

In the display apparatus of the present invention, the metal connecting layer and the output terminal of the driving transistor are located at different metal layers.

Compared to the conventional organic light emitting diode device and corresponding display apparatus, the displaying region of the organic light emitting diode device and the corresponding display apparatus of the present invention is larger than the driving region such that the border region of the organic light emitting diode device can overlap the displaying region. Therefore, it is easier to fulfill the organic light emitting diode device with narrow bezel. The present invention can solve the technical problem of difficulty to achieve narrow bezel in the conventional organic light emitting diode device and corresponding display apparatus.

To make above content of the present invention more easily understood, it will be described in details by using preferred embodiments in conjunction with the appending drawings.

DETAILED DESCRIPTION OF THE PREFERRED EMBODIMENTS

The following descriptions for the respective embodiments are specific embodiments capable of being implemented for illustrations of the present invention with referring to appended figures. In the descriptions of the present invention, spatially relative terms, such as "upper", "lower", "front", "back", "left", "right", "inner", "outer", "lateral", and the like, may be used herein for ease of description as illustrated in the figures. Therefore, it will be understood that the spatially relative terms are intended to illustrate for understanding the present invention, but not to limit the present invention.

In the appending drawings, units having similar structures are labeled by the same reference numbers.

Figure 2A:
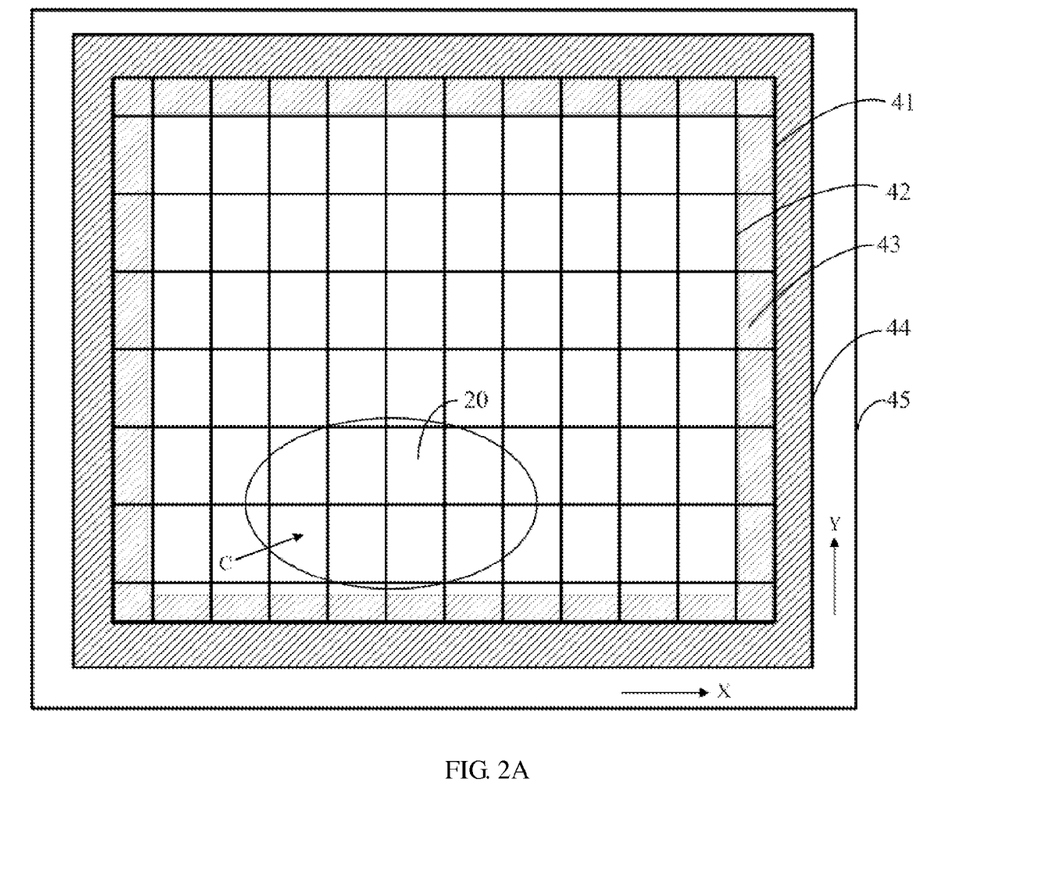
FIG. 2A is a schematic structural diagram showing an organic light emitting diode device according to a first preferable embodiment of the present invention.
Figure 2B:
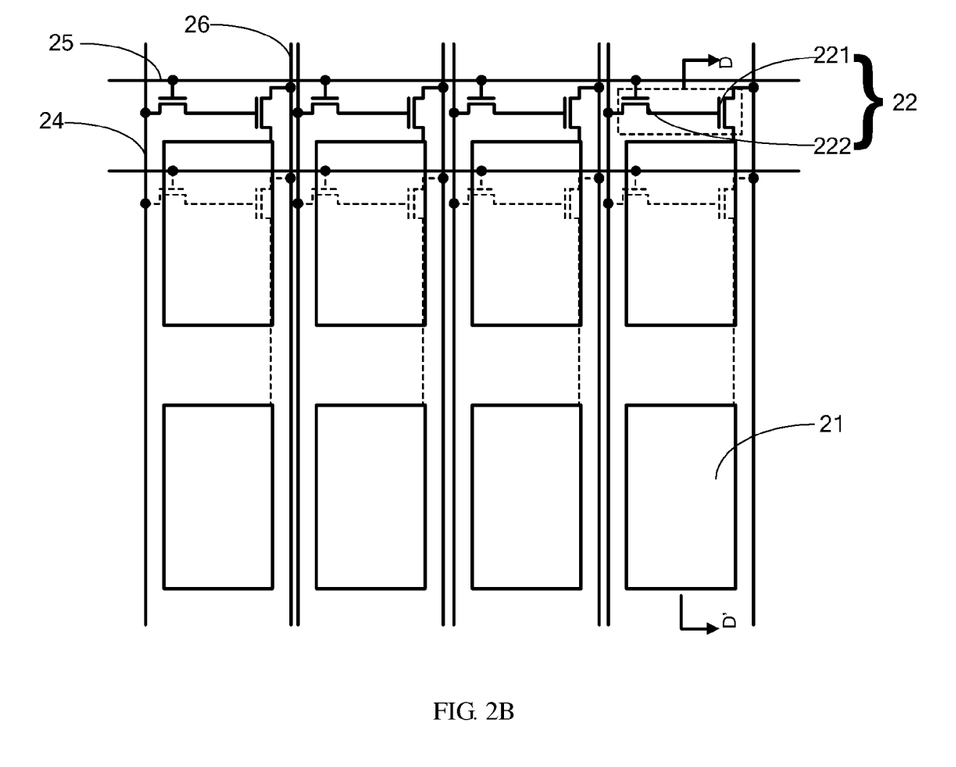
FIG. 2B is a schematic enlarged structural diagram of Part C shown in FIG. 2A.
Figure 2C:
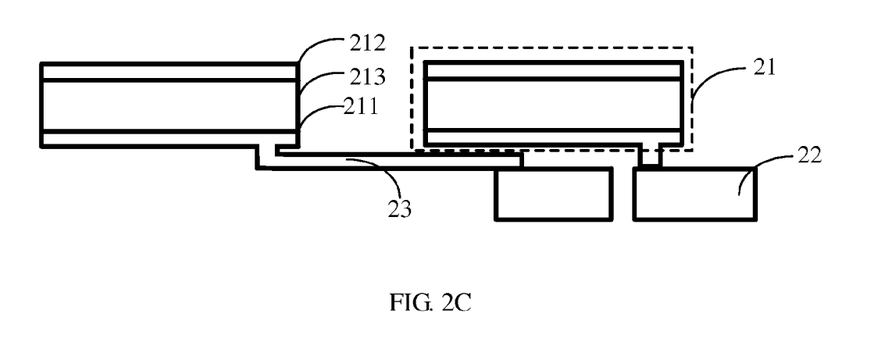
FIG. 2C is a sectional view of FIG. 2B along D-D' direction.
Figure 2D:
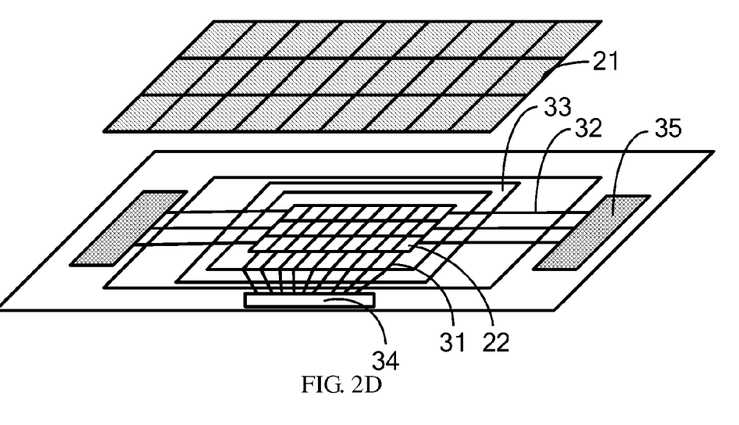
FIG. 2D is a schematic explored view of the organic light emitting diode device according to the first preferable embodiment of the present invention.

Please refer to FIGS. 2A to 2D. FIG. 2A is a schematic structural diagram showing an organic light emitting diode device according to a first preferable embodiment of the present invention. FIG. 2B is a schematic enlarged structural diagram of Part C shown in FIG. 2A. FIG. 2C is a sectional view of FIG. 2B along D-D' direction. FIG. 2D is a schematic explored view of the organic light emitting diode device according to the first preferable embodiment of the present invention.

The organic light emitting diode device comprises a plurality of pixels 20. Each pixel 20 comprises an organic light emitting unit 21 and a driving unit 22 corresponding thereto. The organic light emitting unit 21 is utilized for emitting light rays with corresponding colors. The driving unit 22 is utilized for driving the corresponding organic light emitting unit 21. The organic light emitting unit 21 is connected to the corresponding driving unit 22 via a metal connecting layer 23. The organic light emitting diode device further comprises data lines 24, scan lines 25, power lines 26, data signal wires 31, scan signal wires 32, power signal wires 33, a data signal driving circuit 34, a scan signal driving circuit 35, and an encapsulation object (not shown).

The scan lines 25 are parallel to each other and are extended along an X direction as shown in FIG. 2A. The data lines 24 and the power lines 26 are parallel to each other and are extended along a Y direction as shown in FIG. 2A. Accordingly, the plural scan lines 25 and the plural data lines 24 are interlaced with each other in the X and Y directions.

The driving unit 22 of the pixel 20 comprises a driving transistor 221 and a switching transistor 222. The driving transistor 221 is utilized for driving the corresponding organic light emitting unit 21. The switching transistor 222 is utilized for controlling the driving transistor 221 to turn on and off. A control terminal (e.g., a gate electrode) of the switching transistor 222 is connected to the scan signal driving circuit 35 sequentially via the scan line 25 and the scan signal wire 32. An input terminal (e.g., a source electrode) of the switching transistor 222 is connected to the data signal driving circuit 34 sequentially via the data line 24 and the data signal wire 31. An output terminal (e.g., a drain electrode) of the switching transistor 222 is connected to a control terminal (e.g., a gate electrode) of the driving transistor 221. An input terminal (e.g., a source electrode) of the driving transistor 221 is connected to an outer power source sequentially via the power line 26 and the power signal wire 33. An output terminal (e.g., a drain electrode) of the driving transistor 221 is connected to the organic light emitting unit 21 via the metal connecting layer 23.

The organic light emitting unit 21 comprises an anode 211, a cathode 212, and a plurality of organic emitting layers 213 disposed between the anode 211 and the cathode 212. The anode 211 is connected to the output terminal of the driving transistor 221 via the metal connecting layer 23. The cathode 212 is connected to an outer part providing a common voltage. The plural organic emitting layers 213 emit light rays based on electron-hole coupling. The intensity of light rays emitted from the organic emitting layers 213 depends on the intensity of electrical current that flows out from the output terminal of the driving transistor 221.

As shown in FIG. 2A, the organic light emitting unit 21 of the present invention is disposed in a displaying region 41 of the organic light emitting diode device. The driving unit 22 is disposed in a driving region 42 of the organic light emitting diode device. The power signal wires 33, the data signal wires 31, and the scan signal wires 32 are disposed in a second border region 43 of the organic light emitting diode device. The data signal driving circuit 34 and the scan signal driving circuit 35 are disposed in a first border region 44 of the organic light emitting diode device. The encapsulation object for packaging the organic light emitting diode device is disposed in a packaging region 45 of the organic light emitting diode device.

In the present preferable embodiment, the displaying region 41 no long completely overlaps the driving region 42. Instead, a design of dense arrangement is adopt for the driving unit 22 that will not affect light emission. Then, the organic light emitting unit 21 is connected to the corresponding driving unit 22 via the metal connecting layer 23 such that the occupied area of the driving region 42 is smaller than that of the displaying region 41. Meanwhile, the whole area of the driving region 42 overlaps a part of the displaying region 41. Preferably, the driving region 42 overlaps a central part of the displaying region 41. The second border region 43 located outside the driving region 42 overlaps at least one side of the displaying region 41. FIG. 2A shows the second border region 43 overlaps the displaying region 41 at four sides. The first border region 44 located outside the second border region 43 is also located outside the displaying region 41. In addition, the packaging region 45 is located outside the first border region 44.

By using the metal connecting layer 23 and the dense arrangement of the driving unit 22 as described above, the second border region 43 for disposing the power signal wires 33, the data signal wires 31, and the scan signal wires 32 can overlap the displaying region 41. Accordingly, it no longer has to dispose the aforesaid wires on the border of the organic light emitting diode device. This makes it is easier to fulfill the organic light emitting diode device with narrow bezel.

In the present preferable embodiment, the metal connecting layer 23 and the output terminal of the driving transistor 221 can be located at a same metal layer. That is, the metal connecting layer 23 is manufactured when manufacturing the driving transistor 221. This is more convenient and the manufacturing cost is much low. The metal connecting layer 23 and the output terminal of the driving transistor 221 also can be located at different metal layers. That is, there is another process for manufacturing the metal connecting layer 23 that connects the organic light emitting unit 21 and the driving unit 22. This will make the connection of the metal connecting layer 23 more reliable and make the driving performance of the driving unit 22 more stable.

Figure 3:
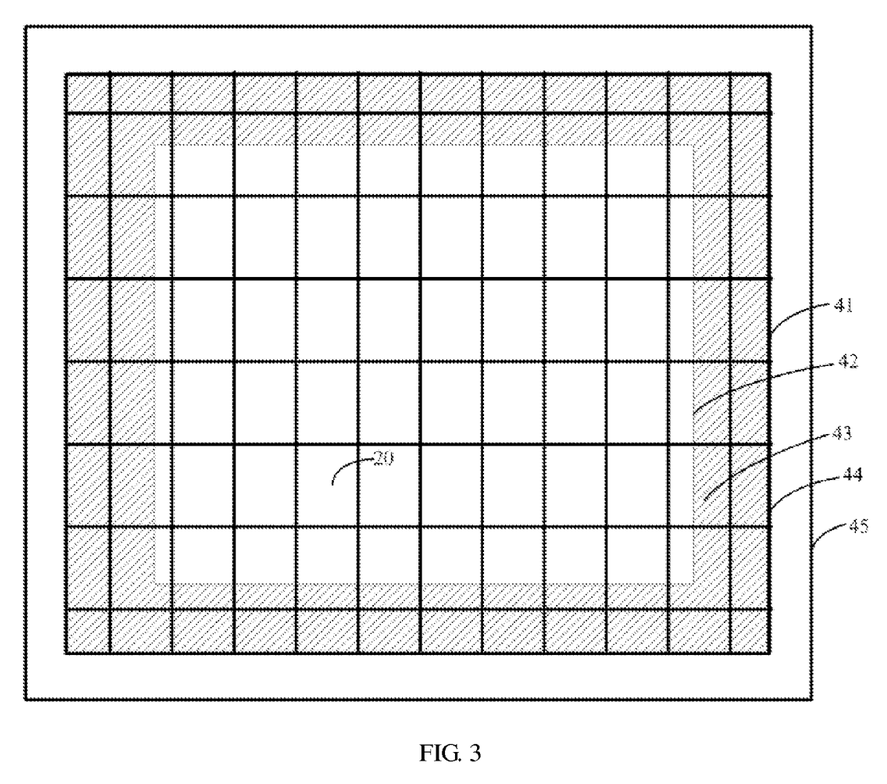
FIG. 3 is a schematic structural diagram showing an organic light emitting diode device according to a second preferable embodiment of the present invention.

FIG. 3 is a schematic structural diagram showing an organic light emitting diode device according to a second preferable embodiment of the present invention. As shown in FIG. 3, the difference between the second preferable embodiment and the first preferable embodiment is that in the second preferable embodiment, the data signal driving circuit 34 and the scan signal driving circuit 35 that are disposed in the first border region 44 of the organic light emitting diode device are manufactured on a glass substrate by deposition. In such a manner, the data signal driving circuit 34 and the scan signal driving circuit 35 also can be designed to overlap the organic light emitting unit 21, without necessary to be disposed at the border or bezel. For this arrangement, the first border region 44 located outside the second border region 43 also overlaps at least one side of the displaying region 41. FIG. 3 shows the first border region 44 overlaps the displaying region 41 at four sides. This further optimizes the narrow bezel design of the organic light emitting diode device.

The present invention further relates to a displaying device. The display apparatus utilizes the afore-mentioned organic light emitting diode device to display images. The detailed usage of the displaying device of the present invention is similar to or the same as the above described embodiments of the organic light emitting diode device, and therefore please refer to the embodiments of the organic light emitting diode device as described above.

In the organic light emitting diode device and the corresponding display apparatus of the present invention, the displaying region is larger than the driving region such that the border region of the organic light emitting diode device can overlap the displaying region. Therefore, it is easier to fulfill the organic light emitting diode device with narrow bezel. The present invention can solve the technical problem of difficulty to achieve narrow bezel in the conventional organic light emitting diode device and corresponding display apparatus.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. An organic light emitting diode device, comprising:
a plurality of pixels, each pixel comprising:
   an organic light emitting unit, for emitting light rays with corresponding colors; and
   a driving unit comprising a driving transistor for driving the organic light emitting unit corresponding to the driving unit, and a switching transistor for controlling the driving transistor to turn on and off;
wherein the driving unit of a first pixel is located right below a second pixel adjacent to the first pixel;
wherein through a metal connecting layer, the organic light emitting unit is connected to a corresponding driving unit which is located beyond the scope of said pixel, the organic light emitting unit is disposed in a displaying region of the organic light emitting diode device, the driving unit is disposed in a driving region of the organic light emitting diode device, the driving region overlaps the displaying region, and the driving region is smaller than the displaying region;
wherein the driving region overlaps a central part of the displaying region;
wherein the organic light emitting diode device further comprises a data signal driving circuit and a scan signal driving circuit that are disposed in a first border region of the organic light emitting diode device, the first border region is located outside the displaying region, and further comprises power signal wires, data signal wires, and scan signal wires that are disposed in a second border region of the organic light emitting diode; the second border region overlaps at least one side of the displaying region.

2. An organic light emitting diode device, comprising:
a plurality of pixels, each pixel comprising:
   an organic light emitting unit, for emitting light rays with corresponding colors; and
   a driving unit comprising a driving transistor for driving the organic light emitting unit corresponding to the driving unit, and a switching transistor for controlling the driving transistor to turn on and off;
wherein the driving unit of a first pixel is located right below a second pixel adjacent to the first pixel;
wherein through a metal connecting layer, the organic light emitting unit is connected to a corresponding driving unit which is located beyond the scope of said pixel, the organic light emitting unit is disposed in a displaying region of the organic light emitting diode device, the driving unit is disposed in a driving region of the organic light emitting diode device, the driving region overlaps the displaying region, and the driving region is smaller than the displaying region;
wherein the organic light emitting diode device further comprises a data signal driving circuit and a scan signal driving circuit that are disposed in a first border region of the organic light emitting diode device, the first border region is located outside the displaying region, and further comprises power signal wires, data signal wires, and scan signal wires that are disposed in a second border region of the organic light emitting diode; the second border region overlaps at least one side of the displaying region.

3. The device according to claim 2, wherein the driving region overlaps a central part of the displaying region.

4. The device according to claim 2 wherein the first border region overlaps at least one side of the displaying region if the data signal driving circuit and the scan signal driving circuit are manufactured on a glass substrate by deposition.

5. The device according to claim 2 further comprising an encapsulation object for packaging the organic light emitting diode device, wherein the encapsulation object is disposed in a packaging region of the organic light emitting diode device and the packaging region is located outside the first border region.

6. The device according to claim 2, wherein the organic light emitting unit comprises:
an anode;
a cathode; and
a plurality of organic emitting layers disposed between the anode and the cathode.

7. The device according to claim 2, further comprising:
a scan line, for providing scan signals;
a data line, for providing data signals; and
a power line, for providing power signals;
wherein a control terminal of the switching transistor is connected to the scan signal driving circuit sequentially via the scan line and the scan signal wire, an input terminal of the switching transistor is connected to the data signal driving circuit sequentially via the data line and the data signal wire, an output terminal of the switching transistor is connected to a control terminal of the driving transistor, an input terminal of the driving transistor is connected to an outer power source sequentially via the power line and the power signal wire, and an output terminal of the driving transistor is connected to the organic light emitting unit via the metal connecting layer.

8. The device according to claim 7, wherein the metal connecting layer and the output terminal of the driving transistor are located at a same metal layer.

9. The device according to claim 7, wherein the metal connecting layer and the output terminal of the driving transistor are located at different metal layers.

10. A display apparatus, having an organic light emitting diode device, which comprises:
a plurality of pixels, each pixel comprising:
   an organic light emitting unit, for emitting light rays with corresponding colors; and
   a driving unit comprising a driving transistor for driving the organic light emitting unit corresponding to the driving unit, and a switching transistor for controlling the driving transistor to turn on and off;

wherein the driving unit of a first pixel is located right below a second pixel adjacent to the first pixel;

wherein through a metal connecting layer, the organic light emitting unit is connected to a corresponding driving unit which is located beyond the scope of said pixel, the organic light emitting unit is disposed in a displaying region of the organic light emitting diode device, the driving unit is disposed in a driving region of the organic light emitting diode device, the driving region overlaps the displaying region, and the driving region is smaller than the displaying region, wherein the organic light emitting diode device further comprises a data signal driving circuit and a scan signal driving circuit that are disposed in a first border region of the organic light emitting diode device, the first border region is located outside the displaying region, and further comprises power signal wires, data signal wires, and scan signal wires that are disposed in a second border region of the organic light emitting diode; the second border region overlaps at least one side of the displaying region.

11. The display apparatus according to claim 10, wherein the driving region overlaps a central part of the displaying region.

12. The display apparatus according to claim 10, wherein the first border region overlaps at least one side of the displaying region if the data signal driving circuit and the scan signal driving circuit are manufactured on a glass substrate by deposition.

13. The display apparatus according to claim 10, wherein the organic light emitting diode device further comprises an encapsulation object for packaging the organic light emitting diode device, wherein the encapsulation object is disposed in a packaging region of the organic light emitting diode device and the packaging region is located outside the first border region.

14. The display apparatus according to claim 10, wherein the organic light emitting unit comprises:
an anode;
a cathode; and
a plurality of organic emitting layers disposed between the anode and the cathode.

15. The display apparatus according to claim 10, wherein the organic light emitting diode device further comprises:
a scan line, for providing scan signals;
a data line, for providing data signals; and
a power line, for providing power signals;
wherein a control terminal of the switching transistor is connected to the scan signal driving circuit sequentially via the scan line and the scan signal wire, an input terminal of the switching transistor is connected to the data signal driving circuit sequentially via the data line and the data signal wire, an output terminal of the switching transistor is connected to a control terminal of the driving transistor, an input terminal of the driving transistor is connected to an outer power source sequentially via the power line and the power signal wire, and an output terminal of the driving transistor is connected to the organic light emitting unit via the metal connecting layer.

16. The display apparatus according to claim 15, wherein the metal connecting layer and the output terminal of the driving transistor are located at a same metal layer.

17. The display apparatus according to claim 15, wherein the metal connecting layer and the output terminal of the driving transistor are located at different metal layers.

* * * * *